US009596751B2

(12) United States Patent
Yamada et al.

(10) Patent No.: US 9,596,751 B2
(45) Date of Patent: Mar. 14, 2017

(54) SUBSTRATE FOR MOUNTING ELECTRONIC ELEMENT AND ELECTRONIC DEVICE

(71) Applicant: KYOCERA Corporation, Kyoto-shi, Kyoto (JP)

(72) Inventors: Hiroshi Yamada, Kyoto (JP); Takuji Okamura, Kyoto (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 17 days.

(21) Appl. No.: 14/773,558

(22) PCT Filed: Mar. 30, 2015

(86) PCT No.: PCT/JP2015/059954
§ 371 (c)(1),
(2) Date: Sep. 8, 2015

(87) PCT Pub. No.: WO2015/163095
PCT Pub. Date: Oct. 29, 2015

(65) Prior Publication Data
US 2016/0128181 A1 May 5, 2016

(30) Foreign Application Priority Data

Apr. 23, 2014 (JP) ................................. 2014-089265

(51) Int. Cl.
*H05K 1/18* (2006.01)
*H05K 1/02* (2006.01)
(Continued)

(52) U.S. Cl.
CPC ......... *H05K 1/0271* (2013.01); *H01L 23/053* (2013.01); *H01L 23/13* (2013.01);
(Continued)

(58) Field of Classification Search
CPC .... H05K 1/0271; H05K 1/182; H05K 1/0313; H05K 2201/09009; H01L 23/053;
(Continued)

(56) References Cited

U.S. PATENT DOCUMENTS 4,993,148 A * 2/1991 Adachi ................. H05K 1/021
  174/252
5,814,883 A * 9/1998 Sawai ..................... H01L 23/04
  257/675

(Continued)

FOREIGN PATENT DOCUMENTS

JP 2006-303400 A 11/2006
JP 2011-228591 A 11/2011

OTHER PUBLICATIONS

International Search Report, PCT/JP2015/059954, May 19, 2015, 2 pgs. (Japanese Language).

*Primary Examiner* — Hoa C Nguyen
(74) *Attorney, Agent, or Firm* — Volpe and Koenig, P.C.

(57) ABSTRACT

There is provided a substrate for mounting electronic elements, including: a frame-shaped first wiring substrate with a first through hole formed in an interior portion thereof; a flat plate-shaped or frame-shaped second wiring substrate arranged to overlap with a bottom surface of the first wiring substrate and electrically connected thereto; and a sheet-shaped metal sheet arranged to overlap with a bottom surface of the second wiring substrate such that the second wiring substrate is sandwiched between the first wiring substrate and the metal sheet, an area inside the frame-shaped first wiring substrate or areas inside the frame-shaped first wiring substrate and second wiring substrate being electronic element mounting areas, and the second wiring substrate having an elastic modulus lower than those of the first wiring substrate and the metal sheet.

16 Claims, 8 Drawing Sheets

(51) Int. Cl.
*H05K 1/03* (2006.01)
*H01L 23/053* (2006.01)
*H01L 23/13* (2006.01)
*H01L 23/15* (2006.01)
*H01L 23/36* (2006.01)
*H05K 1/00* (2006.01)
*H01L 23/00* (2006.01)

(52) U.S. Cl.
CPC .............. *H01L 23/15* (2013.01); *H01L 23/36* (2013.01); *H05K 1/0313* (2013.01); *H05K 1/182* (2013.01); *H01L 23/562* (2013.01); *H01L 2224/48091* (2013.01); *H01L 2224/49175* (2013.01); *H01L 2224/73265* (2013.01); *H01L 2924/3511* (2013.01); *H05K 2201/09009* (2013.01)

(58) Field of Classification Search
CPC ......... H01L 23/13; H01L 23/15; H01L 23/36; H01L 23/562; H01L 2224/48091; H01L 2224/49175; H01L 2224/73265; H01L 2924/00014; H01L 2924/3511
See application file for complete search history.

(56) References Cited

U.S. PATENT DOCUMENTS

| | | | | |
|---|---|---|---|---|
| 6,921,971 | B2* | 7/2005 | Basho | H01L 23/057 257/675 |
| 7,948,069 | B2* | 5/2011 | Zhuang | H01L 23/047 257/678 |
| 2003/0076659 | A1* | 4/2003 | Ichitsubo | H01L 23/13 361/748 |
| 2003/0222344 | A1* | 12/2003 | Hosoyamada | H01L 23/3128 257/738 |
| 2006/0249835 | A1 | 11/2006 | Miyauchi | |
| 2010/0065307 | A1* | 3/2010 | Nagase | H05K 1/021 174/252 |
| 2010/0218985 | A1* | 9/2010 | Kouya | H01L 23/142 174/260 |
| 2010/0226110 | A1* | 9/2010 | Kouya | H01L 23/13 361/783 |
| 2010/0301474 | A1* | 12/2010 | Yang | H01L 21/6835 257/737 |
| 2013/0032388 | A1* | 2/2013 | Lin | H01L 23/3121 174/261 |
| 2013/0337648 | A1* | 12/2013 | Lin | H01L 21/486 438/675 |
| 2014/0070396 | A1* | 3/2014 | Kyozuka | H01L 24/19 257/698 |

* cited by examiner

SUBSTRATE FOR MOUNTING ELECTRONIC ELEMENT AND ELECTRONIC DEVICE

TECHNICAL FIELD

The present invention relates to a substrate on which electronic components such as general electronic elements, image sensors such as charge coupled device (CCD) or complementary metal oxide semiconductor (CMOS) devices, or light-emitting elements such as light-emitting diodes (LEDs) are mounted, and to an electronic device.

BACKGROUND

Electronic devices in which electronic elements are mounted on a substrate are well known. One example of the types of substrates used in these electronic devices is a substrate that comprises a metal sheet and a frame-shaped wiring substrate formed on the top surface of the metal sheet. An electronic device is then formed by mounting electronic elements on the substrate and then forming a lid over the top surface of the substrate. In this type of electronic device, electronic elements are mounted in recesses formed by the top surface of the metal sheet and the inner walls of the wiring substrate, and the electronic device is electrically connected to an external circuit using electrodes formed on a surface such as the top surface of the wiring substrate (see Japanese Unexamined Patent Application Publication No. 2006-303400).

SUMMARY OF THE INVENTION

Problems to be Solved by the Invention

Typically, the wiring substrate which is made from an insulating layer and the metal sheet have different coefficients of thermal expansion, and the metal sheet has a larger coefficient of thermal expansion than the wiring substrate. Therefore, when electronic elements are mounted on the top surface of the metal sheet of the above-mentioned substrate, heat generated during operation of the electronic elements creates thermal stress between the wiring substrate and the metal sheet. This thermal stress is concentrated in the bonding material used to bond the wiring substrate and the metal sheet to one another and can either cause cracks to form in the bonding material or cause the bonding material to separate. In particular, as demand for further miniaturization of electronic devices has grown in recent years, the bonded area between the wiring substrate and the metal sheet has become increasingly small, thereby increasing the risk of separation of the bonding material between the wiring substrate and the metal sheet.

The present invention aims to provide a substrate for mounting electronic elements with which cracking or separation of the bonding material between the metal sheet and the wiring substrate can be prevented, as well as an electronic device made using that substrate.

Means for Solving the Problems

One aspect of the present invention is a substrate for mounting electronic elements, comprising: a frame-shaped first wiring substrate with a first through hole formed in an interior portion thereof; a flat plate-shaped or frame-shaped second wiring substrate arranged so as to overlap with a bottom surface of the first wiring substrate and electrically connected thereto; and a sheet-shaped metal sheet arranged so as to overlap with a bottom surface of the second wiring substrate such that the second wiring substrate is sandwiched between the first wiring substrate and the metal sheet, an area inside the frame-shaped first wiring substrate or areas inside the frame-shaped first wiring substrate and second wiring substrate being electronic element mounting areas, and the second wiring substrate having an elastic modulus lower than those of the first wiring substrate and the metal sheet.

Another aspect of the present invention is an electronic device, comprising: the above-mentioned substrate for mounting electronic elements; and an electronic element mounted in the electronic element mounting area.

Effects of the Invention

With the substrate for mounting electronic elements according to an aspect of the present invention, the second wiring substrate is sandwiched between the first wiring substrate and the metal sheet, and the elastic modulus of the second wiring substrate is lower than those of the first wiring substrate and the metal sheet. Therefore, when the first wiring substrate and the metal sheet are only bonded together by a bonding material, thermal stress due to differences in the coefficients of thermal expansion of the first wiring substrate and the metal sheet is absorbed by deformation of the second wiring substrate, which has a relatively low elastic modulus. This configuration facilitates reducing the magnitude of this thermal stress. As a result, this configuration makes it possible to suppress the occurrence of cracks or separation in the bonding material formed between the first wiring substrate and the metal sheet.

An electronic device according to another aspect of the present invention comprises the above-mentioned substrate for mounting electronic elements and therefore makes it possible to reduce the occurrence of separation between the first wiring substrate and the metal sheet.

DETAILED DESCRIPTION OF EMBODIMENTS

Several exemplary embodiments of the present invention will be described below with reference to drawings. Note that in the following descriptions, an "electronic device" refers to a configuration comprising a substrate on which electronic elements are mounted. In the substrate and the electronic device, any direction can be defined as up or down; however, for convenience, the attached drawings define an orthogonal XYZ coordinate system in which the positive Z direction is defined to be the "up" direction, such that the meanings of terms such as "top surface" and "bottom surface" follow accordingly.

<First Embodiment>

An electronic device 21 and a substrate 1 according to a first embodiment of the present invention will be described below with reference to FIG. 1. The electronic device 21 of the present embodiment comprises the substrate 1 and an electronic element 10.

Figure 1A:
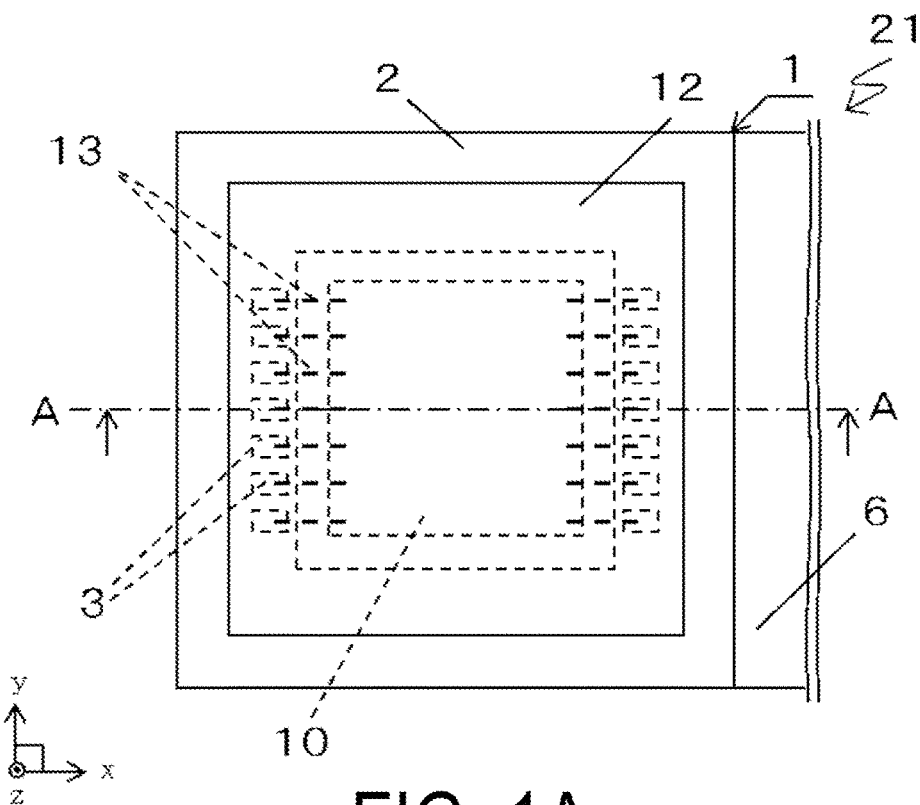
FIG. 1A is a top view of the exterior appearance of a substrate for mounting electronic elements and an electronic device according to a first embodiment of the present invention.
Figure 1B:
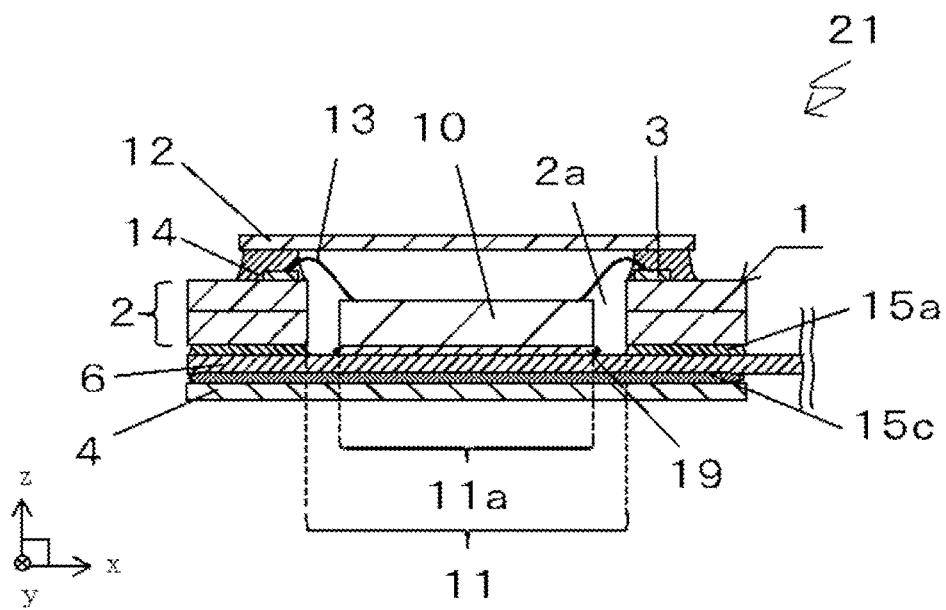
FIG. 1B is a vertical cross-sectional view taken along line A-A in FIG. 1A.

In the example illustrated in FIG. 1, the substrate 1 comprises: a frame-shaped first wiring substrate 2; a flat plate-shaped second wiring substrate 6 that is arranged so as to overlap with the bottom surface of the first wiring substrate 2 and is electrically connected to the first wiring substrate 2; and a sheet-shaped metal sheet 4 that is arranged so as to overlap with the bottom surface of the second wiring substrate 6 such that the second wiring substrate 6 is sandwiched between the first wiring substrate 2 and the metal sheet 4. The area inside of the frame-shaped first wiring substrate 2 is an electronic element mounting area 11, and the elastic modulus of the second wiring substrate 6 is lower than those of the first wiring substrate 2 and the metal sheet 4.

In the example illustrated in FIG. 1, the interior portion of the frame-shaped first wiring substrate 2 forms a first through hole 2a. In addition, in the area inside of the frame-shaped first wiring substrate 2, the electronic element mounting area 11 is formed.

In the example illustrated in FIG. 1, electronic element connection pads 3 are formed on the top surface of the first wiring substrate 2. Moreover, electrodes for connecting to an external circuit (not illustrated) may be formed on the bottom surface of the first wiring substrate 2.

The first wiring substrate 2 comprises wire conductors, which will be described below, formed on an insulating substrate. A material such as an electrically insulating ceramic or resin may be used for this insulating substrate, for example. In the example illustrated in FIG. 1, the first wiring substrate 2 comprises a plurality of insulating layers each made from such a material as described above and layered on top of one another.

The first wiring substrate 2 may be formed using two insulating layers as illustrated in FIG. 1, or may be formed using a single layer or three or more insulating layers.

Wire conductors made from through-conductors that go through the insulating layers and internal wires arranged between the insulating layers may be formed inside of the first wiring substrate 2, or wire conductors exposed on the surface of the first wiring substrate 2 may be formed thereon. Moreover, these wire conductors may be used to electrically connect the electrodes for connecting to an external circuit to the electronic element connection pads 3.

Moreover, electrodes for connecting to an external circuit may be formed on the top surface or side surfaces of the first wiring substrate 2. The electrodes for connecting to an external circuit are provided in order to connect the first wiring substrate 2 to the second wiring substrate 6, which will be described below, an external device, or the like, for example.

In the example illustrated in FIG. 1, the electronic element 10 is housed within the electronic element mounting area 11. More specifically, the electronic element 10 is housed within a recess created by the inner walls of the first wiring substrate 2 and the top surface of the second wiring substrate 6.

In the example illustrated in FIG. 1, the second wiring substrate 6 is arranged so as to overlap with the bottom surface of the first wiring substrate 2 and is electrically connected to the first wiring substrate 2.

The second wiring substrate 6 comprises wire conductors, which will be described below, formed on an insulating substrate. A material such as an electrically insulating ceramic or resin may be used for this insulating substrate, for example. In the example illustrated in FIG. 1, the second wiring substrate 6 comprises a single insulating layer made from such a material as described above. However, the second wiring substrate 6 may be made from two or more insulating layers layered on top of one another.

The second wiring substrate 6 may be formed from a single insulating layer as illustrated in FIG. 1, or from two or more insulating layers.

When the second wiring substrate 6 is formed from two or more insulating layers, wire conductors made from through-conductors that go through each of the insulating layers in combination with internal wires may be formed inside of the second wiring substrate 6, or wire conductors exposed on the surface of the second wiring substrate 6 may be formed thereon. Moreover, these wire conductors may be used to electrically connect the first wiring substrate 2 and the second wiring substrate 6 together.

In the example illustrated in FIG. 1, the first wiring substrate 2 and the second wiring substrate 6 are electrically connected to one another by a conductive first bonding material 15a. For example, electrodes for connecting to an external circuit (not illustrated) formed on the bottom surface of the first wiring substrate 2 may be connected to electrodes for connecting to an external circuit (not illustrated) formed on the top surface of the second wiring substrate 6 via the first bonding material 15a. Examples of materials for the conductive first bonding material 15a include metal materials such as solder and resin materials such as anisotropic conductive films (ACF). Moreover, when the electronic element 10 is an image sensor, for example, transmission of light from a gap between the first wiring substrate 2 and the second wiring substrate 6 can be reduced by using a first bonding material 15a having a color that does not readily allow light to pass through.

Moreover, it is preferable that an insulating adhesive material be provided in the spaces between the bottom surface of the first wiring substrate 2 and the top surface of the second wiring substrate 6 in which the first bonding material 15a is not formed. This configuration makes it possible to improve the bonding strength between the first wiring substrate 2 and the second wiring substrate 6. In addition, this configuration makes it possible to prevent dust from the external environment from entering the above-mentioned space through the gaps formed between the plurality of first bonding materials 15a. Furthermore, this configuration makes it possible to reduce the occurrence of short-circuits between the adjacent first bonding materials 15a due to dust or the like.

Examples of materials for this insulating adhesive material include thermosetting resins such as bisphenol-A liquid epoxy resins.

When the first wiring substrate 2 and the second wiring substrate 6 are made from an electrically insulating ceramic, the electronic element connection pads 3, the electrodes for connecting to an external circuit, and the wire conductors formed on the first wiring substrate 2 and the second wiring substrate 6 may be made from tungsten (W), molybdenum (Mo), manganese (Mn), silver (Ag), copper (Cu), or an alloy or the like containing at least one metal material selected from the above group.

When the first wiring substrate 2 and the second wiring substrate 6 are made from a resin, the electronic element connection pads 3, the electrodes for connecting to an external circuit, and the wire conductors formed on the first wiring substrate 2 and the second wiring substrate 6 may be made from copper (Cu), gold (Au), aluminum (Al), nickel (Ni), chromium (Cr), molybdenum (Mo), titanium (Ti), or an alloy or the like containing at least one metal material selected from the above group.

It is preferable that a plated layer be formed over the exposed surfaces of the electronic element connection pads 3, the electrodes for connecting to an external circuit, and the wire conductors formed on the first wiring substrate 2 and the second wiring substrate 6. This configuration makes it possible to protect and prevent oxidation of the exposed surfaces of the electronic element connection pads 3, the electrodes for connecting to an external circuit, and the wire conductors. Moreover, this configuration makes it possible to satisfactorily form electrical connections between the electronic element connection pads 3 and the electronic element 10 using wire bonding or the like as well as to satisfactorily form electrical connections between the electrodes for connecting to an external circuit of the first wiring substrate 2 and the electrodes for connecting to an external circuit of the second wiring substrate 6. For the plated layer, an Ni plating layer with a thickness of 0.5 to 10 μm may be coated, for example. Moreover, a gold (Au) plating layer with a thickness of 0.5 to 3 μm may be further coated on top of this Ni plating layer.

In the example illustrated in FIG. 1, the metal sheet 4 is provided on the bottom surface of the second wiring substrate 6 such that the second wiring substrate 6 is sandwiched between the first wiring substrate 2 and the metal sheet 4.

As illustrated in FIG. 1, the outer edges of the metal sheet 4 may be positioned at locations that overlap with the outer edges of the first wiring substrate 2 when viewed in a plan view. Moreover, to be described below, the outer edges of the metal sheet 4 may be positioned at locations further inward or further outward than the outer edges of the second wiring substrate 6 when viewed in a plan view.

The outer edges of the metal sheet 4 may also be positioned at locations further outward than the outer edges of the first wiring substrate 2. When the outer edges of the metal sheet 4 are positioned at locations further outward than the outer edges of the first wiring substrate 2, through holes or notches may be formed in the outer region of the metal sheet 4 located on the outer side of the first wiring substrate 2. These through holes or notches can be used to fix the electronic device 21 to an external device, for example.

The metal sheet 4 may be made from a material such as a stainless steel (SUS), an Fe—Ni—Co alloy, alloy 42, copper (Cu) or a copper alloy, or the like.

Moreover, when the primary component of the material used for the first wiring substrate 2 is an aluminum oxide sintered compact with a coefficient of thermal expansion of approximately $5 \times 10^{-6}/°$ C. to $10 \times 10^{-6}/°$ C., for example, it is preferable that the metal sheet 4 be made from stainless steel (SUS 410) with a coefficient of thermal expansion of approximately $10 \times 10^{-6}/°$ C. This combination of materials reduces the differences in thermal contraction and thermal expansion between the first wiring substrate 2 and the metal sheet 4 while the electronic device 21 is operating, thereby making it possible to reduce the magnitude of thermal stress applied to the second wiring substrate 6.

When the electronic element 10 mounted on the substrate 1 is an image sensor, plating such as black Ni plating or the like that readily absorbs lights may be formed on the surface of the metal sheet 4. Forming black Ni plating on the metal sheet 4 inhibits diffused reflection of unnecessary light off of the metal sheet 4, for example, and thereby makes it possible to reduce the occurrence of noise or the like in the resulting image. Moreover, when the electronic element 10 mounted on the substrate 1 is a light-emitting element, for example, plating such as silver plating or the like that readily reflects lights may be formed on the surface of the metal sheet 4. Forming silver plating on the metal sheet 4 promotes reflection of light and enhances the brightness of the electronic device.

In the example illustrated in FIG. 1, the metal sheet 4 is bonded to the second wiring substrate 6 using a second bonding material 15c made from a brazing material, a thermosetting resin, a low-melting glass, or the like. Moreover, a conductive material such as an anisotropic conductive film (ACF) may be used for the second bonding material 15c. Examples of thermosetting resins include bisphenol-A liquid epoxy resins or the like. It is preferable that a material that is not affected by heat generated when the electronic element 10 is mounted or while the electronic element 10 is running be used for the second bonding material 15c because such a material makes it possible to satisfactorily suppress separation of the second wiring substrate 6 and the metal sheet 4 when the electronic element 10 is mounted or while the electronic element 10 is running. Moreover, when the electronic element 10 is an image sensor, for example, transmission of light from between the second wiring substrate 6 and the metal sheet 4 can be reduced by using a second bonding material 15c having a color that does not readily allow light to pass through.

Typically, the first wiring substrate 2 and the metal sheet 4 have different coefficients of thermal expansion. For example, when the first wiring substrate 2 is made from an aluminum oxide sintered compact, the coefficient of thermal expansion of the first wiring substrate 2 is $7.1 \times 10^{-6}/°C$., and when the metal sheet 4 is made from SUS304, the coefficient of thermal expansion of the metal sheet 4 is $17.3 \times 10^{-6}/°C$. The first wiring substrate 2 and the metal sheet 4 are heated while mounting the electronic element 10, when the electronic element 10 is running, when manufacturing the substrate 1, and the like. At these times, the first wiring substrate 2 and the metal sheet 4 experience different thermal expansion/thermal contraction due to their different coefficients of thermal expansion. Differences in thermal expansion/thermal contraction between the first wiring substrate 2 and the metal sheet 4 cause stress to become concentrated in the bonding material used to fix the first wiring substrate 2 and the metal sheet 4 together. Therefore, the bonding material bonding the first wiring substrate 2 and the metal sheet 4 together is prone to cracks or separation as the substrate 1 is repeatedly heated.

In conventional configurations, the components equivalent to the first wiring substrate 2 and the metal sheet 4 were bonded together using a bonding material; however, stress applied to the bonding material could not be sufficiently mitigated due to the small thickness of the bonding material, and the bonding material was prone to cracks or separation. Moreover, if the thickness of the bonding material is increased to promote stress mitigation, the bonding power of the bonding material decreases, and it becomes difficult to keep the overall electronic device thin.

In the present invention, the second wiring substrate 6 which has a relatively low elastic modulus is sandwiched between the first wiring substrate 2 and the metal sheet 4. Therefore, thermal stress caused by the difference in the coefficients of thermal expansion of the first wiring substrate 2 and the metal sheet 4 is mitigated by deformation of the second wiring substrate 6, thereby making it possible to reduce thermal stress. This configuration, in turn, makes it possible to suppress the occurrence of cracks or separation in the first bonding material 15a and the second bonding material 15c.

Moreover, as described above, the second wiring substrate 6 comprises wire conductors and can therefore simultaneously mitigate stress and function as a wiring substrate. Therefore, this configuration removes the need to form a wiring substrate separately from the stress mitigation layer and therefore makes it possible to reduce the overall thickness of the substrate 1.

Furthermore, the second wiring substrate 6 itself exhibits a sufficient stress mitigation effect, thereby removing the need to form the bonding materials (the first bonding material 15a and the second bonding material 15c) on both major surfaces of the second wiring substrate 6 thickly in order to reduce stress. As described above, this makes it possible to prevent decreases in the bonding power of the bonding material.

In addition, sandwiching the second wiring substrate 6 between the first wiring substrate 2 and the metal sheet 4 makes it possible to separate what in conventional technologies would be a single bonding material directly joining the first wiring substrate 2 and the metal sheet 4 together into two separate layers: the first bonding material 15a and the second bonding material 15c. This configuration makes it possible to disperse thermal stress created between the first wiring substrate 2 and the metal sheet 4.

Here, "elastic modulus" may be interpreted to refer to a physical property of the primary material constituting each member. For example, the elastic modulus of the first wiring substrate 2 and the second wiring substrate 6 may be interpreted to be a physical property of the insulating substrates constituting each. Moreover, the elastic modulus of the metal sheet 4 may be interpreted to be a physical property of the metal material constituting the metal sheet 4.

For example, when the first wiring substrate 2 is made from an aluminum oxide sintered compact, the elastic modulus of the first wiring substrate 2 may be interpreted to be the elastic modulus of aluminum oxide.

Next, specific examples of materials for the first wiring substrate 2, the second wiring substrate 6, and the metal sheet 4 will be described. These materials may be selected such that according to the above-mentioned definition of elastic modulus, the elastic modulus of the second wiring substrate is lower than those of the first wiring substrate and the metal sheet.

Examples of electrically insulating ceramics for the insulating substrates of the first wiring substrate 2 include: aluminum oxide sintered compacts, mullite sintered compacts, silicon carbide sintered compacts, aluminum nitride sintered compacts, silicon nitride sintered compacts, glass ceramic sintered compacts, and the like.

Examples of resins for the insulating substrates of the first wiring substrate 2 include: epoxy resins, polyimide resins, acrylic resins, phenolic resins, fluorinated resins, and the like. One example of a fluorinated resin is polytetrafluoroethylene.

Examples of electrically insulating ceramics for the insulating substrate of the second wiring substrate 6 include aluminum oxide sintered compacts, glass ceramic sintered compacts, and the like.

Examples of resins for the insulating substrate of the second wiring substrate 6 include: epoxy resins, polyimide resins, acrylic resins, phenolic resins, fluorinated resins, and the like. One example of a fluorinated resin is polytetrafluoroethylene.

When a resin material is used for the second wiring substrate 6, the second wiring substrate 6 may be a so-called flexible wiring substrate.

The metal sheet 4 may be made from a material such as a stainless steel (SUS), an Fe—Ni—Co alloy, alloy 42, copper (Cu) or a copper alloy, or the like.

Next, an example of a combination of materials for these members will be described. When the first wiring substrate 2 is made from an aluminum oxide sintered compact (elastic modulus: approximately 200 to 370 GPa) and the metal sheet 4 is made from SUS304 (elastic modulus: approximately 190 to 210 GPa), the second wiring substrate 6 may be made from a polyimide resin (elastic modulus: approximately 3 to 7 GPa).

In the example illustrated in FIG. 1, the outer edges of the metal sheet 4 are positioned at locations that overlap with the outer edges of the second wiring substrate 6 when viewed in a plan view. This configuration makes it possible to increase the bonding area between the metal sheet 4 and the second wiring substrate 6 in comparison with a configuration in which the outer edges of the metal sheet 4 are positioned further inward than the outer edges of the second wiring substrate 6, for example. Therefore, when the electronic element 10 generates heat that creates thermal stress due to thermal contraction between the metal sheet 4 and the first wiring substrate 2, the stress applied to the second bonding material 15c between the second wiring substrate 6 and the metal sheet 4 can be reduced. As a result, this configuration makes it possible to reduce separation between the second wiring substrate 6 and the metal sheet 4.

Moreover, in the example illustrated in FIG. 1, the outer edges of the second wiring substrate 6 are positioned at locations that overlap with the outer edges of the first wiring substrate 2 when viewed in a plan view. This configuration makes it possible to increase the bonding area between the first wiring substrate 2 and the second wiring substrate 6 in comparison with a configuration in which the outer edges of the second wiring substrate 6 are positioned further inward than the outer edges of the first wiring substrate 2, for example. Therefore, when the electronic element 10 generates heat that creates thermal stress due to thermal contraction between the first wiring substrate 2 and the second wiring substrate 6, the stress applied to the first bonding material 15a between the first wiring substrate 2 and the second wiring substrate 6 can be reduced. As a result, this configuration makes it possible to reduce separation between the first wiring substrate 2 and the second wiring substrate 6.

Moreover, as representative examples of the electronic element 10 have continued to exhibit increased functionality in recent years, the number of electronic element connection pads and electrodes for connecting to an external circuit have increased, thereby increasing the area required for bonding. Positioning the outer edges of the second wiring substrate 6 at locations that overlap with the outer edges of the first wiring substrate 2 when viewed in a plan view makes it possible to increase the bonding area between the first wiring substrate 2 and the second wiring substrate 6 in comparison with a configuration in which the outer edges of the second wiring substrate 6 are positioned further inward than the outer edges of the first wiring substrate 2, for example. This configuration makes it possible to increase the wiring area of the second wiring substrate 6, thereby facilitating supporting a larger number of pins on the substrate 1. Note that the same effect can also be achieved by positioning the outer edges of the second wiring substrate 6 further outward than the outer edges of the first wiring substrate 2.

Furthermore, it is preferable that the first wiring substrate 2 and the second wiring substrate 6 be fixed together using a first bonding material 15a made from a conductive resin. This configuration allows the first bonding material 15a itself to more easily undergo deformation than when a brazing material or the like is used for the first bonding material 15a because the elastic modulus of conductive resins is relatively low. Therefore, this configuration allows the first bonding material 15a to follow thermal expansion of the first wiring substrate 2 similar to the second wiring substrate 6 and thereby makes it possible to mitigate thermal stress. As a result, this configuration makes it possible to reduce separation between the first wiring substrate 2 and the second wiring substrate 6.

Moreover, it is preferable that the first bonding material 15a be an anisotropic conductive resin. In this case, forming the first bonding material 15a around the entire periphery of the electronic element mounting area 11 makes it possible to make this area 11 air tight while simultaneously preventing short-circuits between adjacent electrodes for connecting to an external circuit formed on the bottom surface of the first wiring substrate 2.

Next, the electronic device 21 will be described with reference to FIG. 1. In the example illustrated in FIG. 1, the electronic device 21 comprises a substrate for mounting electronic elements 1 and an electronic element 10 mounted in an electronic element mounting area 11. Moreover, in the example illustrated in FIG. 1, the electronic device 21 comprises a lid 12 bonded to the top surface of the substrate 1.

The electronic element 10 is an image sensor such as a CCD or CMOS sensor, a light-emitting element such as an LED, or a computing element such as memory or an ASIC, for example. In the example illustrated in FIG. 1, each of the electrodes of the electronic element 10 is electrically connected to electronic element connection pads 3 via connecting members 13 (bonding wires). The connecting members 13 may also be metal bumps or solder instead of bonding wires, for example.

Furthermore, in the example illustrated in FIG. 1, the electronic element 10 is fixed to the top surface of the second wiring substrate 6 using an adhesive agent 19. This adhesive agent 19 may be a silver epoxy, a thermosetting resin, or the like, for example.

The lid 12 is a flat plate-shaped optical filter, for example. Moreover, when the electronic element 10 is an image sensor or a light-emitting element, for example, a material with high transparency such as a glass or an optical filter may be used for the lid 12. When the electronic element 10 is a computing element such as memory or an ASIC, for example, the lid 12 may be a flat plate made from a metal material. The lid 12 is bonded to the top surface of the first wiring substrate 2 using a bonding material 14 such as a thermosetting resin or a low-melting glass, for example.

The electronic device 21 of the present invention comprises a substrate 1 configured as described above, an electronic element 10 mounted in an electronic element mounting area 11, and a lid 12 bonded to the top surface of the first wiring substrate 2 of the substrate 1. This configuration makes it possible to reduce the occurrence of cracks or separation in the first bonding material 15a and the second bonding material 15c formed between the first wiring substrate 2 and the metal sheet 4 and also makes it possible to provide an electronic device 21 that is tightly sealed.

Next, an example of a method for manufacturing the substrate for mounting electronic elements 1 of the present embodiment will be described.

The example manufacturing method described below uses a wiring substrate from which several separate wiring substrates are obtained.

(1) First, a ceramic green sheet constituting the first wiring substrate 2 is formed. To obtain an aluminum oxide ($Al_2O_3$) sintered compact for the first wiring substrate 2, for example, an $Al_2O_3$ powder is mixed with a silica ($SiO_2$), magnesia (MgO), or calcia (CaO) powder as a sintering additive as well as a suitable binder and a solvent or plasticizer. This mixture is then blended to produce a slurry. Next, a well-known conventional forming method using a doctor blade or a calender, for example, is used to produce a ceramic green sheet for producing multiple wiring substrates.

Moreover, when the first wiring substrate 2 is made from a resin, for example, the first wiring substrate 2 can be formed using a metal mold having the prescribed shape in a transfer molding process or injection molding process.

Furthermore, the first wiring substrate 2 may be made from a base material made from glass fibers impregnated with a resin such as a glass epoxy resin. In this case, the first wiring substrate 2 can be formed by impregnating glass fibers with the epoxy resin precursor and then heat-curing the epoxy resin precursor at a prescribed temperature.

(2) Next, using a screen printing process or the like, a metal paste is applied or filled into the portions of the ceramic green sheet obtained in step (1) that will become the electronic element connection pads 3, the electrodes for connecting to an external circuit, and the wire conductors comprising through-conductors and internal wires.

This metal paste is produced by adding a suitable solvent and binder to the above-mentioned metal powder and blending the resulting mixture to achieve a suitable viscosity. Moreover, this metal paste may also comprise a glass or ceramic material to increase the bond strength between the paste and the first wiring substrate 2.

(3) Next, the green sheet is formed into the desired shape using a metal mold or the like. A first through hole 2a that serves as the interior region of a frame shape is formed in the center portion of the green sheet used for the first wiring substrate 2.

(4) Next, the ceramic green sheets that will become the insulating layers are layered together, and pressure is applied thereto to form a ceramic green sheet stacked body that will later become the first wiring substrate 2. During this process, separate green sheet stacked bodies that will form the layers of the first wiring substrate 2 may be layered together and have pressure applied thereto to form the overall green sheet stacked body that will become the first wiring substrate 2.

(5) Next, the ceramic green sheet stacked body is sintered at a temperature of approximately 1500° C. to 1800° C. to produce a wiring substrate that comprises a plurality of first wiring substrates 2 in array. During this process, the above-mentioned metal paste is sintered at the same time as the ceramic green sheet that will become the first wiring substrate 2, thereby forming the electronic element connection pads 3, the electrodes for connecting to an external circuit, and the wire conductors.

(6) Next, the sintered wiring substrate is divided into multiple first wiring substrates 2. To do this, grooves are formed in the wiring substrate at the positions where the outer edges of the first wiring substrates 2 will be located. Then, the wiring substrate is broken along these grooves or sliced along these grooves to divide the wiring substrate along what will be the outer edges of the first wiring substrates 2. These grooves may be formed after sintering by using a slicing device to make cuts in the wiring substrate that are shallower than the overall thickness thereof. These grooves may also be formed using a cutter blade on the ceramic green sheet stacked body for the wiring substrate and then using a slicing device to make cuts in the ceramic green sheet stacked body that are shallower than the overall thickness thereof.

(7) Next, the second wiring substrate 6 that will be bonded to the bottom surface of the first wiring substrate 2 is prepared. The second wiring substrate 6 is made from an electrically insulating ceramic or resin, for example. The second wiring substrate 6 may be formed using the same process used for the first wiring substrate 2 as described above in steps (1) to (6). Moreover, when the second wiring substrate 6 is a flexible wiring substrate, circuit patterns may be formed on a polyimide substrate using a photoresist layer formation process and a developing/etching/stripping (DES) process or the like and then forming a polyimide cover film on top of the circuit pattern, for example.

(8) Next, the metal sheet 4 that will be bonded to the bottom surface of the second wiring substrate 6 is prepared. The metal sheet 4 is produced from a metal sheet using a well-known conventional stamping process using a stamping die, an etching process, or the like. Then, if the metal sheet 4 is made from an Fe—Ni—Co alloy, alloy 42, or Cu or a copper alloy, for example, the surfaces of the metal sheet 4 may be nickel-plated or gold-plated. This plating makes it possible to effectively prevent formation of oxidation corrosion on the surfaces of the metal sheet 4. Note that the plated layer formed at this time may be selected as appropriate according to the type of electronic element 10 that will be mounted. For example, when the electronic element 10 is an image sensor, plating that readily absorbs light such as black Ni plating may be formed, and when the electronic element 10 is a light-emitting element, plating that readily reflects light such as silver plating may be formed.

(9) Next, the metal sheet 4 is bonded to the second wiring substrate 6 using the second bonding material 15c. In this process, a thermosetting resin paste (an adhesive material) is applied to one of the bonding surfaces of the second wiring substrate 6 and the metal sheet 4 using a screen printing method, a dispensing method, or the like. The second wiring substrate 6-metal sheet 4 assembly is then allowed to dry in a tunnel-type atmosphere furnace or oven, and then the assembly is heated to approximately 150° C. for approximately 90 minutes in the tunnel-type atmosphere furnace or oven to fully cure the second bonding material 15c and strongly bond the second wiring substrate 6 and metal sheet 4 together.

The second bonding material 15c is obtained by mixing together a primary ingredient such as a bisphenol-A liquid epoxy resin, a bisphenol-F liquid epoxy resin, or a phenolic novolac liquid resin; a filler such as a spherical silicon oxide; a hardening agent composed primarily of an acid anhydride such as tetrahydromethylphtalic anhydride, or the like; and a coloring agent such as carbon powder. The resulting mixture is blended together into a paste using a centrifugal mixer or the like.

Moreover, a material in which an epoxy resin such as a bisphenol-A epoxy resin, a bisphenol-A modified epoxy resin, and bisphenol-F epoxy resin, a phenolic novolac epoxy resin, a cresol novolac epoxy resin, a special novolac epoxy resin, a phenol derivative epoxy resin, or an epoxy resin having a bisphenol skeleton is mixed with a hardening agent such as an imidazole-, amine-, phosphorous-, hydrazine-, imidazole adduct-, amine adduct-, cationic polymer-, or dicyandiamide-based hardening agent may be used for the second bonding material 15c, for example.

(10) Next, the electrodes for connecting to an external circuit formed on the bottom surface of the first wiring substrate 2 are bonded to the electrodes for connecting to an external circuit formed on the top surface of the second wiring substrate 6 using the first bonding material 15a. Examples of materials for the first bonding material 15a include metal materials such as solder and resin materials such as anisotropic conductive films.

When the first bonding material 15a is made from solder, for example, a solder paste may be applied to the second wiring substrate 6 to fix the second wiring substrate 6 to the first wiring substrate 2 at prescribed locations. Then, while applying pressure, the solder paste may be reflowed to bond and electrically connect the wiring substrates together.

Furthermore, when the first bonding material 15a is an anisotropic conductive resin, for example, the first bonding material 15a that is made from a anisotropic conductive resin may be applied to prescribed locations on the first wiring substrate 2 or the second wiring substrate 6. Then, while applying pressure, the assembly may be heated to bond and electrically connect the first wiring substrate 2 and the second wiring substrate 6 together.

Moreover, as described above, an adhesive material made from an insulating resin or the like may be applied at areas between adjacent first bonding materials 15a. This configuration makes it possible to fill in any gaps between the first wiring substrate 2 and the second wiring substrate 6.

The substrate for mounting electronic elements 1 can be produced by bonding the first wiring substrate 2 and the second wiring substrate 6 together as described above.

The substrate for mounting electronic elements 1 is obtained according to steps (1) to (10) as described above. Note that steps (1) to (10) do not necessarily have to be performed in the order presented here. For example, the metal sheet 4 may be bonded to the second wiring substrate 6 after bonding the first wiring substrate 2 to the second wiring substrate 6.

The electronic device 21 can then be produced by mounting the electronic element 10 in the electronic element mounting area 11 of the substrate 1 formed as described above.

<Second Embodiment>

Next, a substrate for mounting electronic elements 1 and an electronic device 21 according to a second embodiment of the present invention will be described with reference to FIG. 2. Note that in FIG. 2, the lid 12 of the electronic device 21 is not depicted.

The electronic device 21 according to the present embodiment differs from the electronic device 21 of the first embodiment in that a second through hole 6a that overlaps with the first through hole 2a is formed in the interior region of the second wiring substrate 6 to give the second wiring substrate 6 a frame shape as well.

Figure 2A:
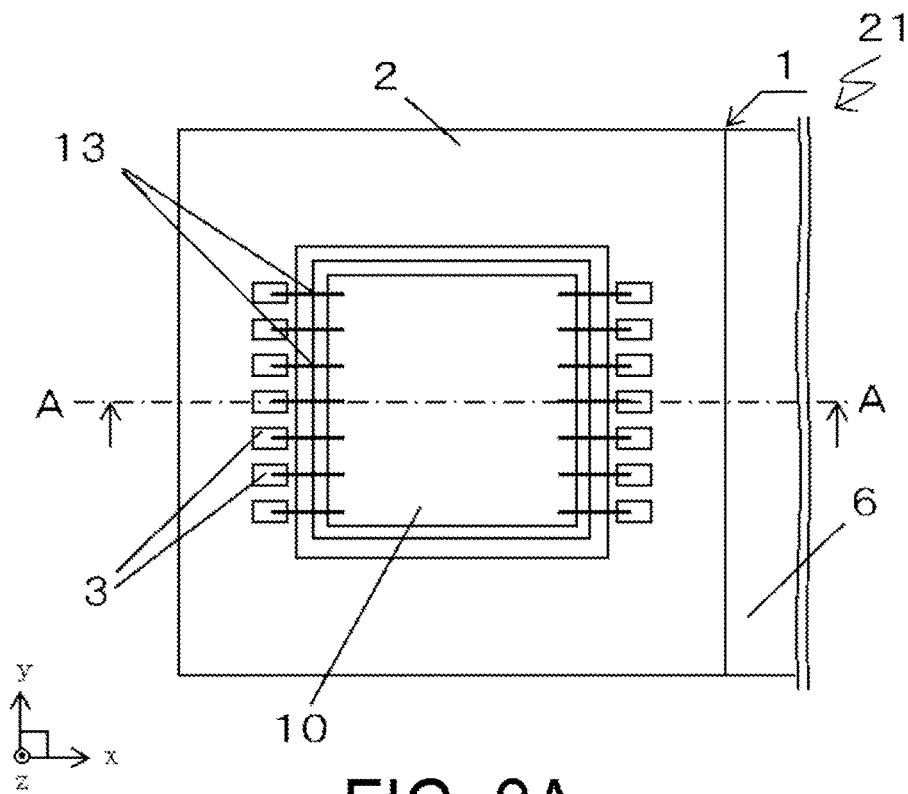
FIG. 2A is a top view of the exterior appearance of a substrate for mounting electronic elements and an electronic device according to a second embodiment of the present invention.
Figure 2B:
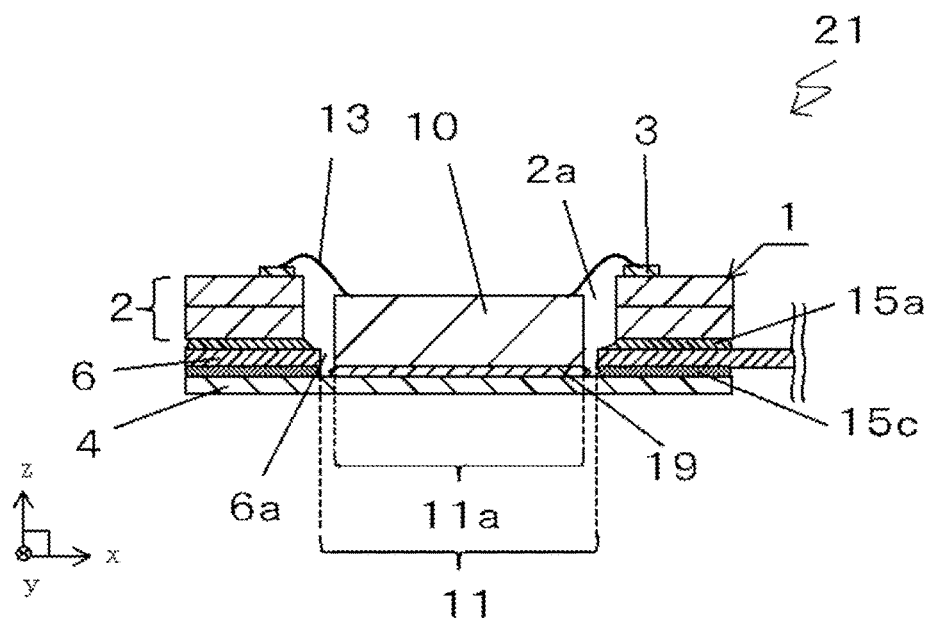
FIG. 2B is a vertical cross-sectional view taken along line A-A in FIG. 2A.

In the example illustrated in FIG. 2, the second wiring substrate 6 is frame-shaped and has a second through hole 6a that is formed in the interior region thereof and overlaps with the first through hole 2a. It is preferable that the top surface of the metal sheet 4 be exposed by the second through hole 6a in the electronic element mounting area 11 to form an electronic element mounting portion 11a. In this configuration, the electronic element 10 is mounted directly on the top surface of the metal sheet 4 without the second wiring substrate 6 being disposed therebetween, thereby making it possible to enhance dissipation of heat produced while the electronic element 10 is running. Therefore, the overall substrate 1 is less prone to becoming heated to high temperatures, and deformation due to differences in thermal expansion between the first wiring substrate 2 and the metal sheet 4 is reduced. This configuration, in turn, makes it possible to reduce the occurrence of cracks or separation in the first bonding material 15a and the second bonding material 15c formed between the first wiring substrate 2 and the metal sheet 4. Moreover, the electronic element 10 is mounted directly on the top surface of the metal sheet 4 without the second wiring substrate 6 being disposed therebetween. Therefore, when the electronic element 10 is an image sensor, this configuration makes it possible to reduce the distance from the lens to the rear (bottom) surface of the substrate 1 (that is, the height of the camera module) by an amount equal to the thickness of the second wiring substrate 6 without changing the focal length from the lens to the light-receiving face of the image sensor.

Moreover, in the example illustrated in FIG. 2, the inner walls of the second through hole 6a are positioned further inward than the inner walls of the first through hole 2a. This configuration makes it possible to increase the bonding area between the first wiring substrate 2 and the second wiring substrate 6 in comparison with a configuration in which the inner walls of the second through hole 6a are positioned further outward than the inner walls of the first wiring substrate 2, for example. Moreover, keeping this configuration and also positioning the outer faces of the second wiring substrate 6 further outward than the outer faces of the first wiring substrate 2 makes it possible to reliably maintain the desired bonding area even if misalignments occur while bonding the first wiring substrate 2 and the second wiring substrate 6 together. This configuration, in turn, makes it possible to reduce the occurrence of cracks or separation in the first bonding material 15a and the second bonding material 15c formed between the first wiring substrate 2 and the metal sheet 4. Moreover, fillets may be formed in the insulating adhesive material provided near and around the first bonding material 15a or the like. This configuration makes it possible to improve the bonding strength between the first wiring substrate 2 and the second wiring substrate 6.

To form the second through hole 6a in the second wiring substrate 6, a metal die or the like may be used to stamp out the second through hole 6a at a prescribed position, a laser may be used to form the second through hole 6a, or a photolithography process may be used to form the second through hole 6a, for example.

<Third Embodiment>

Next, a substrate for mounting electronic elements 1 and an electronic device 21 according to a third embodiment of the present invention will be described with reference to FIG. 3. Note that in FIG. 3, the lid 12 of the electronic device 21 is not depicted.

The electronic device 21 according to the present embodiment differs from the electronic device 21 of the second embodiment in that the second through hole 6a is formed such that the inner walls thereof overlap with the inner walls of the first through hole 2a when viewed in a top view.

Figure 3A:
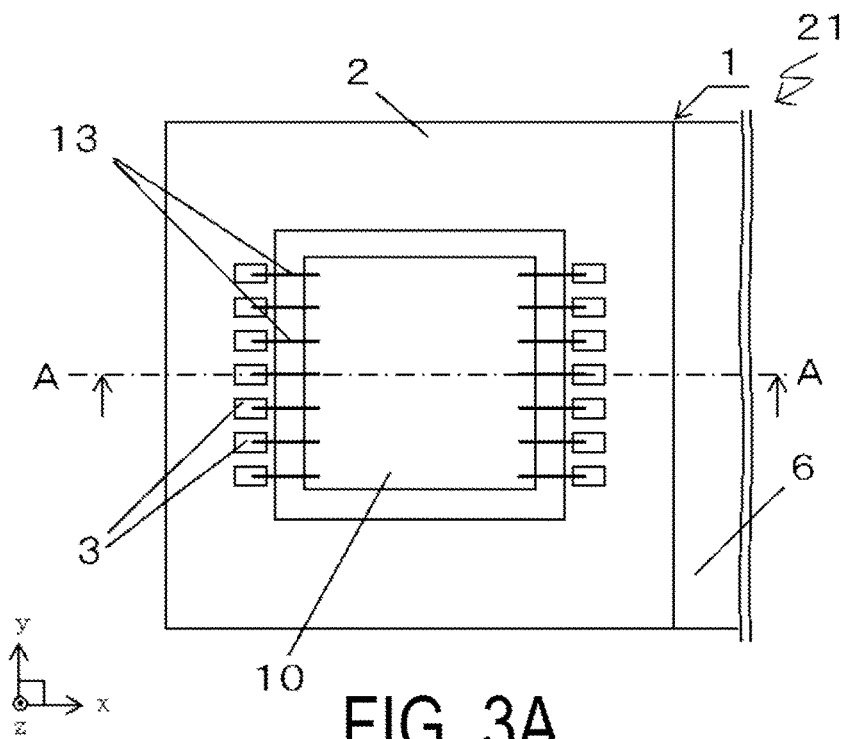
FIG. 3A is a top view of the exterior appearance of a substrate for mounting electronic elements and an electronic device according to a third embodiment of the present invention.
Figure 3B:
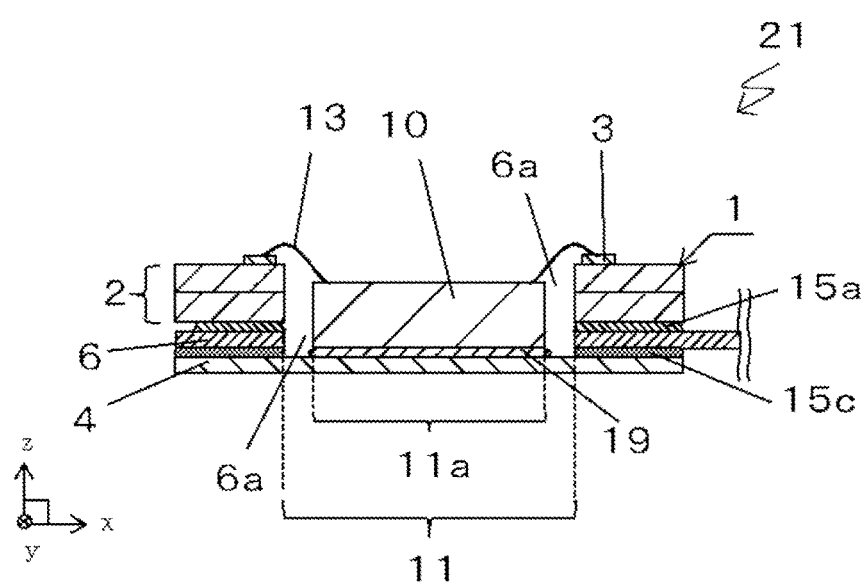
FIG. 3B is a vertical cross-sectional view taken along line A-A in FIG. 3A.

In the example illustrated in FIG. 3, the inner walls of the second through hole 6a are positioned to overlap with the inner walls of the first through hole 2a when viewed in a top view. In this configuration, the electronic element 10 can be mounted closer to the inner walls of the second through hole 6a, thereby making it possible to decrease the distance between the electronic element 10 and the electronic element connection pads 3 formed on the top surface of the first wiring substrate 2. When the connecting members 13 are bonding wires or the like, this configuration makes it possible to shorten the wire loop length. Decreasing the wire loop length makes it possible to decrease the overall resistance of the bonding wires and thereby reduce temperature increases. As a result, temperature increases can be reduced both in the bonding wires and in the first wiring substrate 2 and the second wiring substrate 6 which are connected to the bonding wires and receive signals therethrough. Therefore, the overall substrate 1 is less prone to becoming heated to high temperatures, and deformation due to differences in thermal expansion between the first wiring substrate 2 and the metal sheet 4 is reduced. This configuration, in turn, makes it possible to reduce the occurrence of cracks or separation in the first bonding material 15a and the second bonding material 15c formed between the first wiring substrate 2 and the metal sheet 4.

Moreover, having the inner walls of the second through hole 6a be overlapped with the inner walls of the first through hole 2a when viewed in a top view makes it possible to see misalignments in bonding by eye while bonding the first wiring substrate 2 and the second wiring substrate 6 together, thereby making it possible to confirm the magnitude of bonding misalignments between the external connection terminals of the first wiring substrate 2 and the electrodes of the second wiring substrate 6. Therefore, the bonding process can be simplified.

<Fourth Embodiment>

Next, a substrate for mounting electronic elements 1 and an electronic device 21 according to a fourth embodiment of the present invention will be described with reference to FIG. 4. Note that in FIG. 4, the lid 12 of the electronic device 21 is not depicted.

The electronic device 21 according to the present embodiment differs from the electronic device 21 of the second embodiment in that the inner walls of the second through hole 6a are positioned further outward than the inner walls of the first through hole 2a and in that the outer edges of the second wiring substrate 6 are positioned further inward than the outer edges of the first wiring substrate 2.

Figure 4A:
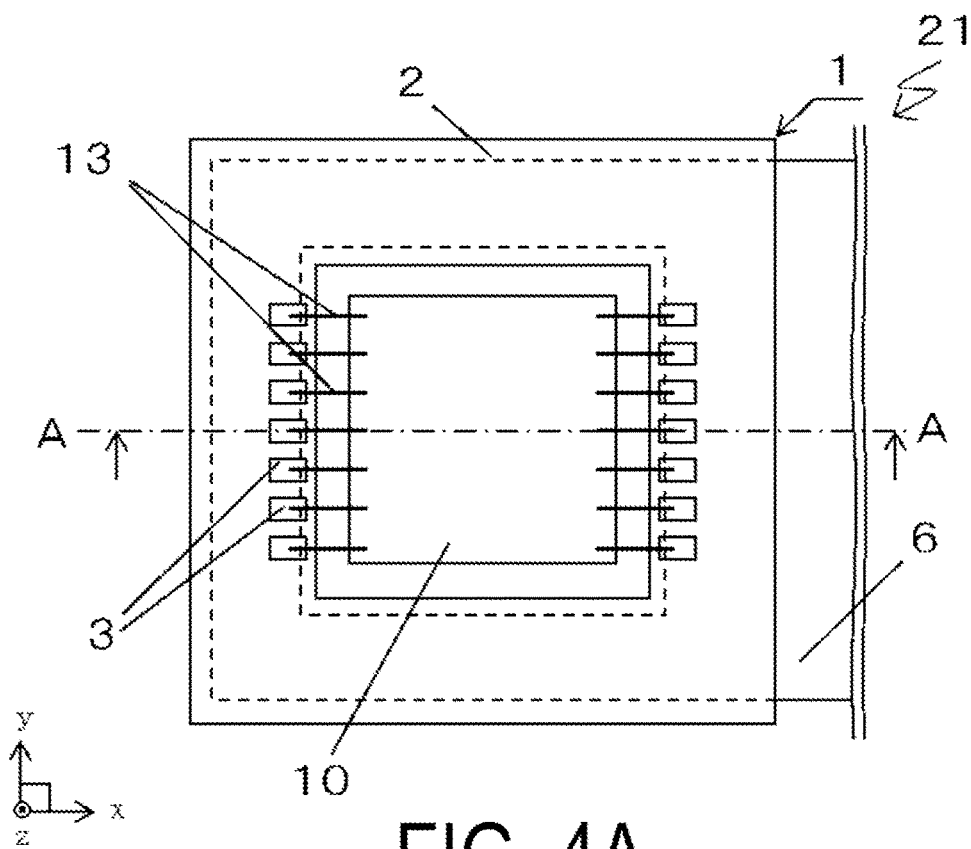
FIG. 4A is a top view of the exterior appearance of a substrate for mounting electronic elements and an electronic device according to a fourth embodiment of the present invention.
Figure 4B:
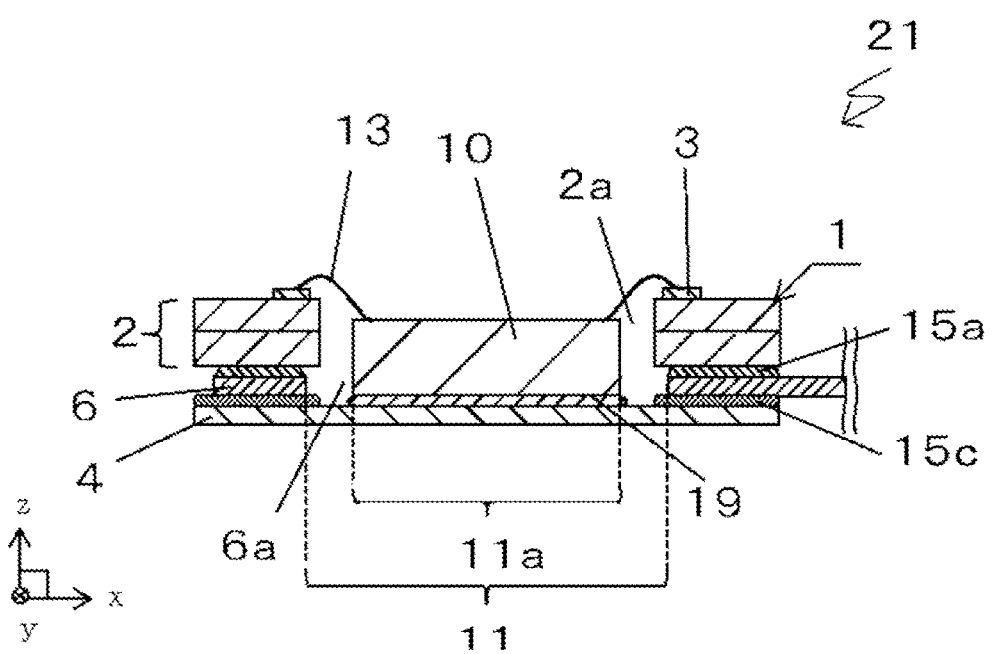
FIG. 4B is a vertical cross-sectional view taken along line A-A in FIG. 4A.

In the example illustrated in FIG. 4, the inner walls of the second through hole 6a of the second wiring substrate 6 are positioned further outward than the inner walls of the first wiring substrate 2. This configuration makes it possible to sufficiently separate the inner walls of the second wiring substrate 6 from the electronic element mounting portion 11a. As a result, a prescribed amount of space can be maintained for the electronic element mounting portion 11a even if slight misalignment errors occur when bonding the second wiring substrate 6 to the metal sheet 4.

Moreover, in the example illustrated in FIG. 4, the outer edges of the second wiring substrate 6 (except for the outer edge in the positive X direction) are positioned further inward than the outer edges of the first wiring substrate 2. This configuration makes it possible to form the first bonding material 15a in a fillet shape from the outer face of the second wiring substrate 6 to the bottom surface of the first wiring substrate 2. Therefore, this configuration makes it possible to improve the bonding strength between the first wiring substrate 2 and the second wiring substrate 6.

Moreover, this configuration makes it possible to reduce the amount of first bonding material 15a that spreads out onto the outer faces of the first wiring substrate 2 when bonding the first wiring substrate 2 and the second wiring substrate 6 together. Therefore, this configuration makes it possible to suppress the occurrence of thermal stress generated due to differences in the thermal expansion of the first wiring substrate 2 and the first bonding material 15a that spreads out thinly onto the outer faces of the first wiring substrate 2. As a result, this configuration makes it possible to reduce the occurrence of situations in which cracks form in the first bonding material 15a and expand, thereby causing the first wiring substrate 2 to separate from the second wiring substrate 6.

Moreover, as in the example illustrated in FIG. 4, when the second bonding material 15c is an insulating resin, it is preferable that the inner edges of the second bonding material 15c be positioned further inward than the inner walls of the second through hole 6a when viewed in a top view. This configuration makes it possible to reduce the amount of water moisture that gets between the second wiring substrate 6 and the second bonding material 15c when condensation forms on the top surface of the metal sheet 4 due to heating or cooling of the electronic element 10, for example. Therefore, this configuration makes it possible to reduce the occurrence of migration in the exposed wire conductors or the like on the bottom surface of the second wiring substrate 6. Moreover, this configuration makes it possible to reduce the occurrence of short-circuits between the second wiring substrate 6 and the metal sheet 4 due to condensation, thereby making it possible to reduce the occurrence of migration in the metal sheet 4. As a result, this configuration makes it possible to reduce the occurrence of separation between the metal sheet 4 and the second bonding material 15c.

<Fifth Embodiment>

Next, a substrate for mounting electronic elements 1 and an electronic device 21 according to a fifth embodiment of the present invention will be described with reference to FIG. 5. Note that in FIG. 5, the lid 12 of the electronic device 21 is not depicted.

The electronic device 21 according to the present embodiment differs from the electronic device 21 of the fourth embodiment in that the outer edges of the metal sheet 4 are positioned further inward than the outer edges of the second wiring substrate 6 when viewed in a top view and in that the first wiring substrate 2 has a stepped configuration.

Figure 5A:
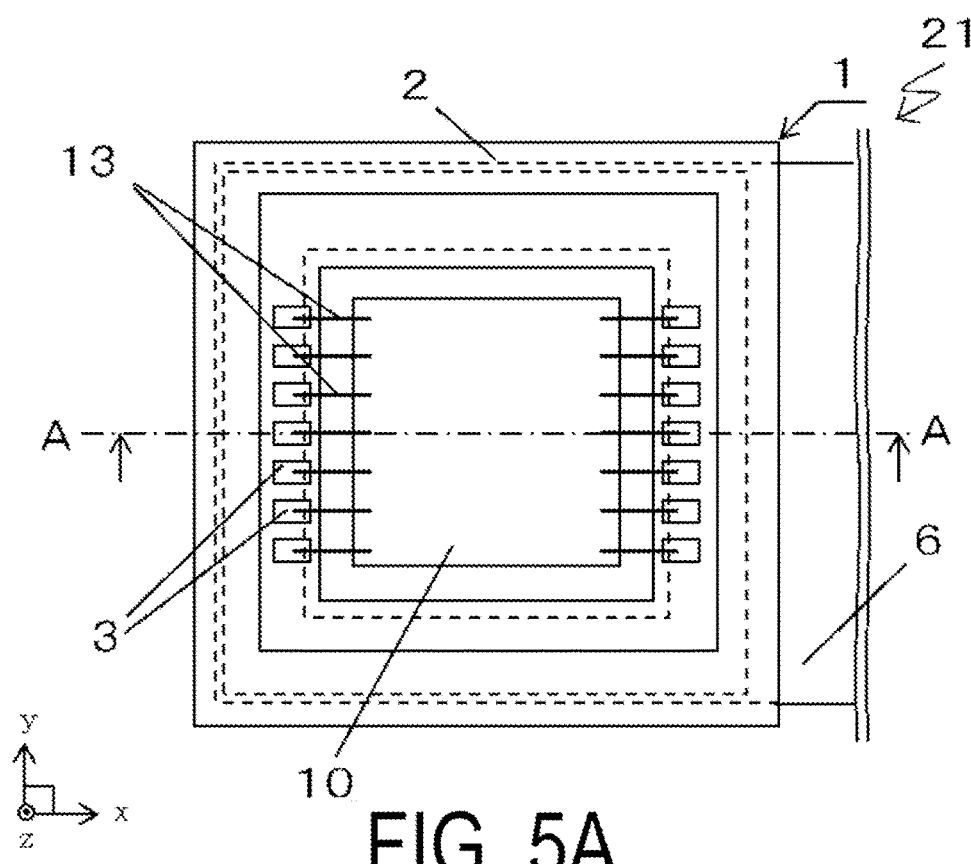
FIG. 5A is a top view of the exterior appearance of a substrate for mounting electronic elements and an electronic device according to a fifth embodiment of the present invention.
Figure 5B:
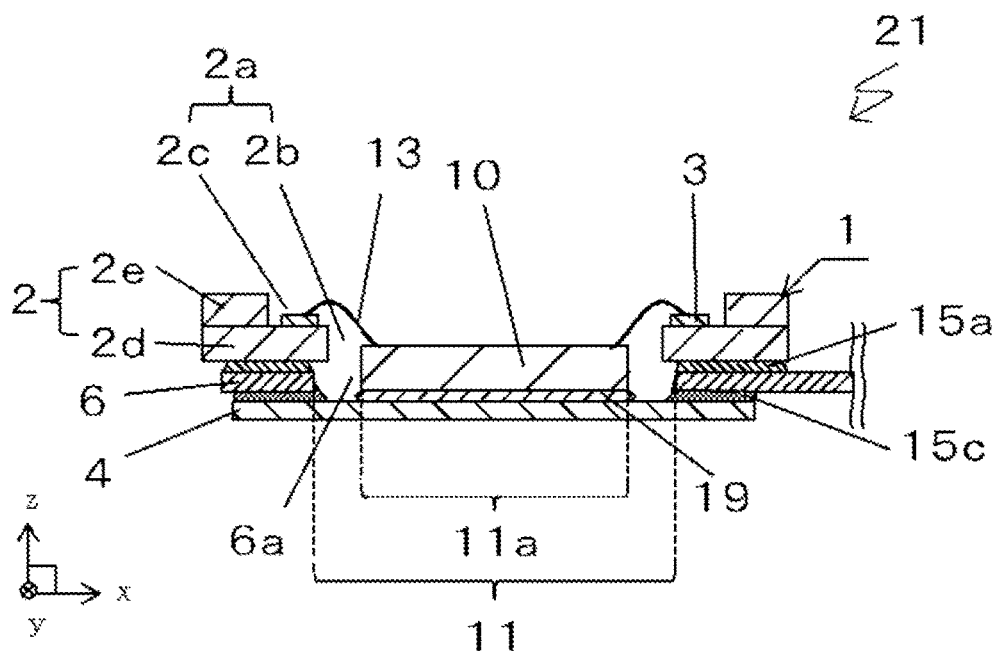
FIG. 5B is a vertical cross-sectional view taken along line A-A in FIG. 5A.

In the example illustrated in FIG. 5, the outer edges of the metal sheet 4 are positioned further inward than the outer edges of the second wiring substrate 6 (except in the positive X direction). In this configuration, the metal sheet 4 does not protrude outwards, thereby making it possible to reduce the occurrence of bending or other deformation of the metal sheet 4 during handling or the like, for example. Therefore, this configuration makes it possible to reduce the possibility of the second wiring substrate 6 separating from the metal sheet 4. Moreover, reducing the size of the metal sheet 4 in this manner makes it possible to reduce deformation due to thermal expansion, thereby making it possible to reduce thermal stress in the second bonding material 15c. As a result, this configuration thereby makes it possible to reduce separation between the second wiring substrate 6 and the metal sheet 4.

Moreover, it is preferable that the second bonding material 15c extend out to the outer edges of the metal sheet 4. This configuration makes it possible to reduce the magnitude of bending stress applied to the first wiring substrate 2 and the second wiring substrate 6 with the outer edge of the metal sheet 4 serving as a fulcrum when applying pressure to the assembly from the top surface of the first wiring substrate 2 while mounting components or the like.

In the example illustrated in FIG. 5, the first wiring substrate 2 comprises a first frame 2d having a third through hole 2b and a second frame 2e that has a fourth through hole 2c and is arranged on the top surface of the first frame 2d. The third through hole 2b and the fourth through hole 2c are connected together to form a first through hole 2a. Moreover, a stepped portion is formed by the inner sidewalls of the second frame 2e and the top surface of the first frame 2d, and electronic element connection pads 3 are formed on this stepped portion. When the connecting members 13 are bonding wires, forming the electronic element connection pads 3 on the stepped portion in this manner makes it possible to lower the apices of the bonding wires. Therefore, when sealing the substrate for mounting electronic elements 1 using a lid 12 and a bonding material 14, contact between the bonding wires and the lid 12 can be reduced.

Moreover, wire conductors may be formed within the first wiring substrate 2 that comprises the first frame 2d and the second frame 2e. Furthermore, in the first wiring substrate 2, wire conductors formed within the first frame 2d and wire conductors formed within the second frame 2e may be electrically connected to exposed wire conductors or the like formed on the surfaces of the first frame 2d or the second frame 2e.

<Sixth Embodiment>

Next, a substrate for mounting electronic elements 1 and an electronic device 21 according to a sixth embodiment of the present invention will be described with reference to FIG. 6. Note that in FIG. 6, the lid 12 of the electronic device 21 is not depicted.

The electronic device 21 according to the present embodiment differs from the electronic devices 21 of the first and second embodiments in that a resin 15b is formed on the side surfaces of the second wiring substrate 6 or on the inner walls of the second through hole 6a.

Figure 6A:
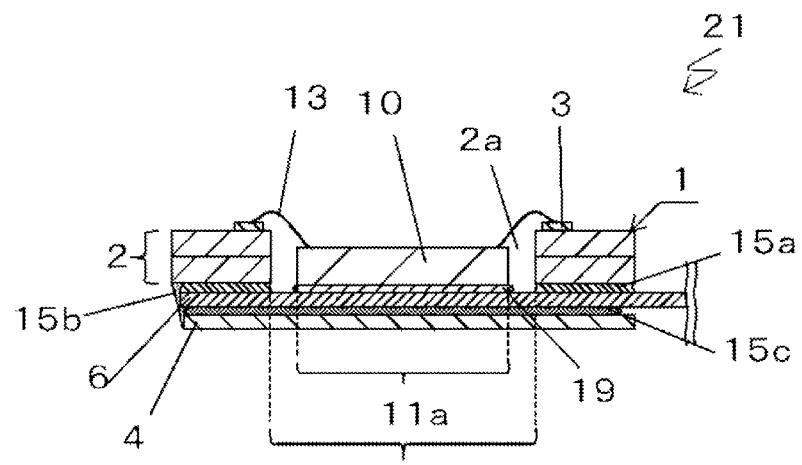
FIG. 6A is a vertical cross-sectional view of a substrate for mounting electronic elements and an electronic device according to a sixth embodiment of the present invention.

In the example illustrated in FIG. 6A, a resin 15b is formed on the side surfaces of the second wiring substrate 6 of the substrate 1. When the second wiring substrate 6 is produced using a stamping process with a metal die, for example, dust may be created on the cross section where the second wiring substrate 6 is stamped. In this configuration, a resin 15b is formed on the side surfaces of the second wiring substrate 6, thereby making it possible to reduce the amount of dust created.

Moreover, it is preferable that the resin 15b be formed covering the side surfaces of the second wiring substrate 6 because this configuration more effectively inhibits creation of dust.

Moreover, when the resin 15b is connected to the first bonding material 15a and the second bonding material 15c or to the first wiring substrate 2 and the metal sheet 4, the resin 15b improves the bonding strength between the first wiring substrate 2 and the second wiring substrate 6 or between the second wiring substrate 6 and the metal sheet 4, thereby making it possible to reduce the occurrence of cracks or separation in the first bonding material 15a and the second bonding material 15c.

Figure 6B:
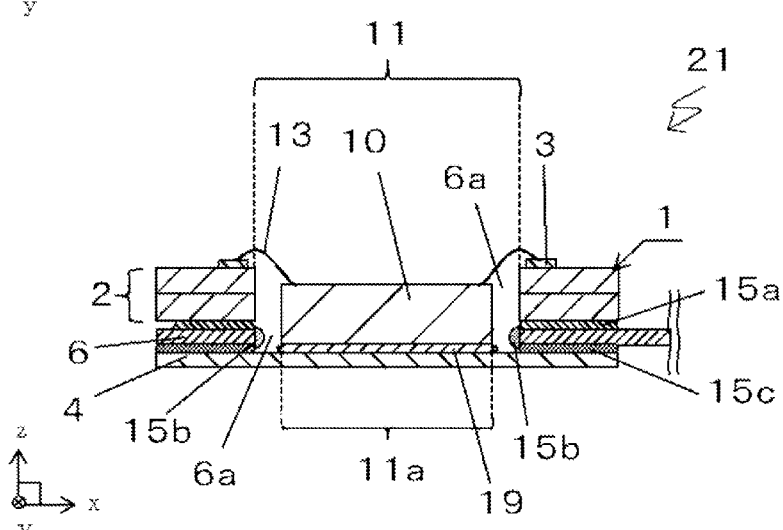
FIG. 6B is a vertical cross-sectional view of a substrate for mounting electronic elements and an electronic device according to a modification of the sixth embodiment of the present invention.

In the example illustrated in FIG. 6B, a resin 15b is formed on the inner walls of the second through hole 6a of the substrate 1. When the second through hole 6a of the second wiring substrate 6 is formed using a stamping process with a metal die, for example, dust may be created on the cross section where the second wiring substrate 6 is stamped. In this configuration, a resin 15b is formed on the inner walls of the second through hole 6a, thereby making it possible to reduce the amount of dust created.

Moreover, it is preferable that the resin 15b be formed covering the inner walls of the second wiring substrate 6 because this configuration more effectively inhibits creation of dust.

Moreover, like in the example illustrated in FIG. 6A, when the resin 15b is connected to the first bonding material 15a and the second bonding material 15c or to the first wiring substrate 2 and the metal sheet 4, the resin 15b improves the bonding strength between the first wiring substrate 2 and the second wiring substrate 6 or between the second wiring substrate 6 and the metal sheet 4. This configuration, in turn, makes it possible to reduce the occurrence of cracks or separation in the first bonding material 15a and the second bonding material 15c.

Examples of materials for the resin 15b include thermosetting resins such as bisphenol-A liquid epoxy resins. The resin 15b may be formed by applying the precursor of the thermosetting resin to the side surfaces of the second wiring substrate 6 or to the inner walls of the second through hole 6a and then reflowing or the like to apply heat.

Moreover, when the second through hole 6a is formed in the second wiring substrate 6 of the electronic device 21, the resin 15b may be formed both on the side surfaces of the second wiring substrate 6 and on the inner walls of the second through hole 6a. This configuration can reduce dust formation and is preferable.

<Seventh Embodiment>

Next, a substrate for mounting electronic elements 1 and an electronic device 21 according to a seventh embodiment of the present invention will be described with reference to FIG. 7. Note that in FIG. 7, the lid 12 of the electronic device 21 is not depicted.

The electronic device 21 according to the present embodiment differs from the electronic device 21 of the sixth embodiment in that a resin 15b is formed on the inner walls of the second through hole 6a and contacts both the first wiring substrate 2 and the metal sheet 4.

Figure 7A:
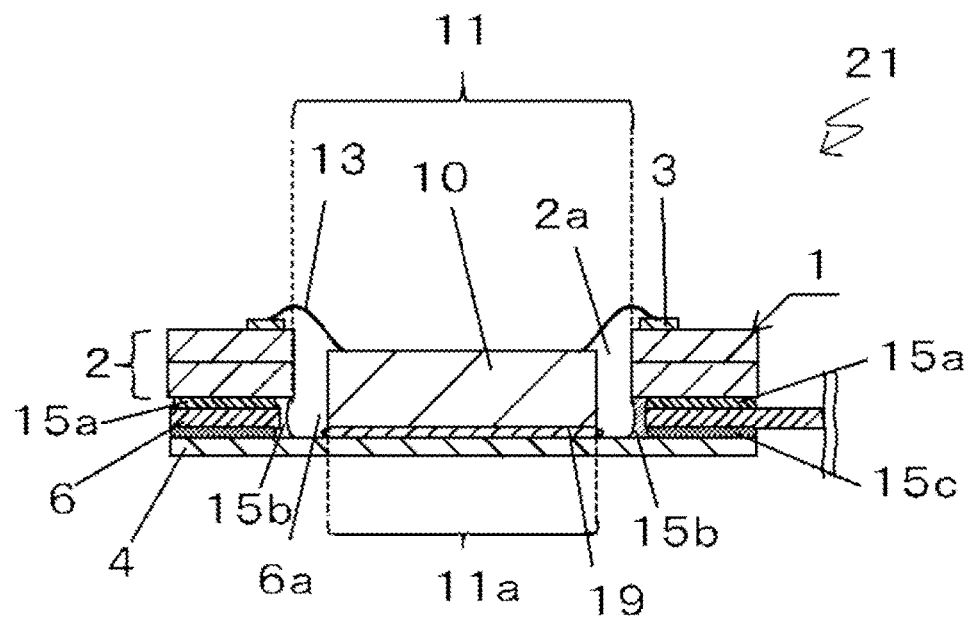
FIG. 7A is a vertical cross-sectional view of a substrate for mounting electronic elements and an electronic device according to a seventh embodiment of the present invention.

In the example illustrated in FIG. 7A, the second wiring substrate 6 and the metal sheet 4 of the substrate 1 are bonded together by the second bonding material 15c. The resin 15b is formed across the side surfaces of the first bonding material 15a, the inner walls of the second through hole 6a, and the side surfaces of the second bonding material 15c. This configuration makes it possible to cover any air gaps formed between the first bonding material 15a and the second wiring substrate 6 or between the second bonding material 15c and the second wiring substrate 6.

Moreover, as illustrated in FIG. 7A, it is preferable that the resin 15b contact the first wiring substrate 2 and the metal sheet 4. This configuration makes it possible to cover any air gaps formed between the first bonding material 15a and the first wiring substrate 2 or the second wiring substrate 6 as well as any air gaps between the second bonding material 15c and the second wiring substrate 6 or the metal sheet 4. Therefore, this configuration makes it possible to reduce decreases in bonding strength due to deterioration of the first bonding material 15a or the second bonding material 15c.

Moreover, when the electronic element 10 is an image sensor, making the resin 15b a color that absorbs light such as black makes it possible to reduce the amount of unnecessary light that enters from outside the electronic device 21 as well as the amount of light that reflects off of the metal sheet 4 onto the electronic element 10.

Figure 7B:
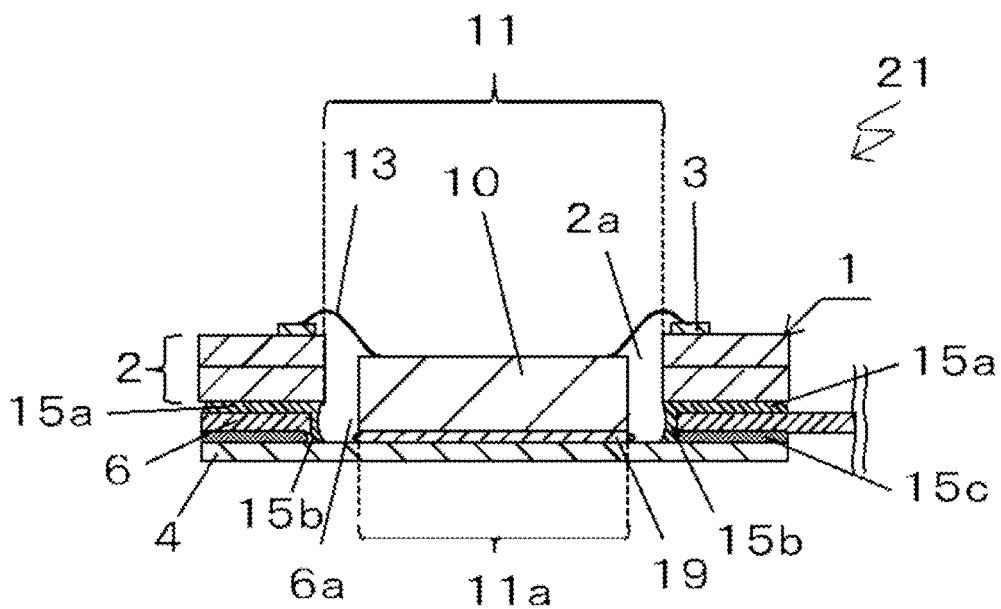
FIG. 7B is a cross-sectional view of a substrate for mounting electronic elements and an electronic device according to a modification of the seventh embodiment of the present invention.

In the example illustrated in FIG. 7B, the first wiring substrate 2 and the second wiring substrate 6 of the substrate 1 are bonded together by the first bonding material 15a, which is made from a conductive resin, and the second wiring substrate 6 and the metal sheet 4 are bonded together by the second bonding material 15c. The resin 15b is formed across the side surfaces of the first bonding material 15a, the inner walls of the second through hole 6a, and the side surfaces of the second bonding material 15c. Furthermore, in the example illustrated in FIG. 7B, the resin 15b is made from a conductive resin like the first bonding material 15a, and the resin 15b is continuously connected to the first bonding material 15a. This configuration makes it possible to cover any air gaps formed between the first bonding material 15a and the second wiring substrate 6 or between the second bonding material 15c and the second wiring substrate 6.

Here, examples of conductive resins include anisotropic conductive films (ACF) and anisotropic conductive pastes (ACP), for example.

Note that the resin 15b and the second bonding material 15c may be made from the same material such as a thermosetting resin, for example, and may be continuously connected to one another, although this configuration is not depicted in FIG. 7.

In this case, the resin 15b can be formed as illustrated in FIG. 7B as follows. During a process for positioning an anisotropic conductive film, for example, the anisotropic conductive film may be formed with an increased area or thickness. Then, the anisotropic conductive film may be reflowed or the like to apply heat thereto, thereby causing the anisotropic conductive film to melt to be a resin film and form the resin 15b. Alternatively, when the first wiring substrate 2 and the second wiring substrate 6 are bonded together by the first bonding material 15a, the pressure applied during the bonding process may be increased to cause the first bonding material 15a to spread out onto the inner walls of the second through hole 6a and the side surfaces of the second bonding material 15c, thereby forming the resin 15b thereon.

<Eighth Embodiment>

Next, a substrate for mounting electronic elements 1 and an electronic device 21 according to an eighth embodiment of the present invention will be described with reference to FIG. 8. Note that in FIG. 8, the lid 12 of the electronic device 21 is not depicted.

The electronic device 21 according to the present embodiment differs from the electronic device 21 of the seventh embodiment in that the first bonding material 15a, the resin 15b, and the second bonding material 15c are all made from the same material and are continuously connected to one another.

Figure 8:
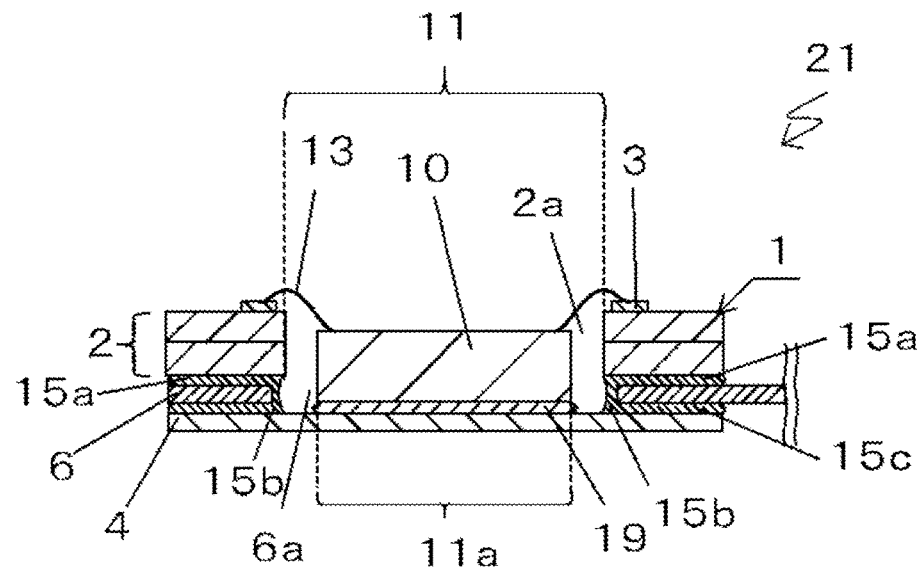
FIG. 8 is a vertical cross-sectional view of a substrate for mounting electronic elements and an electronic device according to an eighth embodiment of the present invention.

In the example illustrated in FIG. 8, the first wiring substrate 2 and the second wiring substrate 6 are bonded together by the first bonding material 15a, which is made from a conductive resin, and the second wiring substrate 6 and the metal sheet 4 are bonded together by the second bonding material 15c, which is made from the same conductive resin. The resin 15b, which is also made from the same conductive resin, is formed across the side surfaces of the first bonding material 15a, the inner walls of the second through hole 6a, and the side surfaces of the second bonding material 15c.

Moreover, bonding together the second wiring substrate 6 and the metal sheet 4 using a conductive resin or the like, as illustrated in the example in FIG. 8, makes it possible to give the second wiring substrate 6 and the metal sheet 4 the same electric potential by connecting the metal sheet 4 and electrodes formed on the bottom surface of the second wiring substrate 6 to a ground electrode, for example. This configuration makes it possible to improve shielding of wires formed in the second wiring substrate 6, thereby making it possible to satisfactorily transmit electrical signals to outside of the second wiring substrate 6.

It should be noted that the present invention is not limited to the examples given in the embodiments described above, and various numerical modifications or the like may be made.

Moreover, the first through hole 2a of the first wiring substrate 2 and the second through hole 6a of the second wiring substrate 6 are depicted as being rectangular in the examples illustrated in FIGS. 1 to 8. However, these through holes may also be circular or have some other polygonal shape.

Furthermore, the arrangement, number, shape, or the like of the electronic element connection pads 3 of the present embodiment is not particularly limited.

Figure 9:
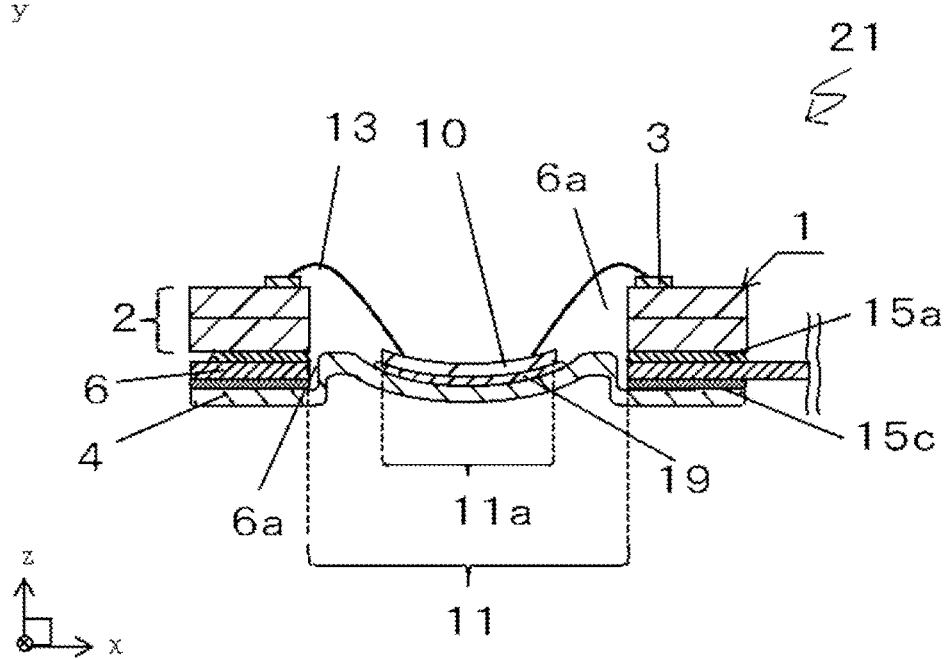
FIG. 9 is a vertical cross-sectional view of a substrate for mounting electronic elements and an electronic device according to another example of an embodiment of the present invention.

In addition, the shape of the metal sheet 4 is not limited to a flat sheet shape. As illustrated in the example in FIG. 9, when the second wiring substrate 6 is frame-shaped and the electronic element 10 is a curved component such as a curved image sensor, for example, the portions of the metal sheet 4 that overlap with the second through hole 6a may be curved to match the curve of the electronic element 10. This configuration makes it possible to stably mount the electronic element 10 by matching the curved shape thereof, thereby making it possible to limit stress while mounting the electronic element 10.

Moreover, various combinations of the characteristic portions of these embodiments are possible, and the present invention is not limited to the examples of embodiments described above.

REFERENCE NUMBERS

1 Substrate for mounting electronic element
2 First wiring substrate
2a First through hole
2b Third through hole
2c Fourth through hole
2d First frame
2e Second frame
3 Electronic element connection pad
4 Metal sheet
6 Second wiring substrate
6a Second through hole
10 Electronic element
11 Electronic element mounting area
11a Electronic element mounting portion
12 Lid
13 Connecting member
14 Bonding material
15a First bonding material
15b Resin
15c Second bonding material
19 Adhesive agent
20 External circuit board
21 Electronic devices

What is claimed is:

1. A substrate for mounting electronic elements, comprising:
   a frame-shaped first wiring substrate with a first through hole formed in an interior portion thereof;
   a flat plate-shaped or frame-shaped second wiring substrate arranged to overlap with a bottom surface of the first wiring substrate and electrically connected thereto; and
   a sheet-shaped metal sheet arranged to overlap with a bottom surface of the second wiring substrate such that the second wiring substrate is sandwiched between the first wiring substrate and the metal sheet,
   an area inside the frame-shaped first wiring substrate or areas inside the frame-shaped first wiring substrate and second wiring substrate being electronic element mounting areas, and
   the second wiring substrate having an elastic modulus lower than those of the first wiring substrate and the metal sheet.

2. The substrate for mounting electronic elements according to claim 1, wherein
   the second wiring substrate is frame-shaped and has a second through hole that overlaps with the first through hole formed in an interior portion thereof, and
   a top surface of the metal sheet is exposed by the second through hole in the electronic element mounting area to form an electronic element mounting portion.

3. The substrate for mounting electronic elements according to claim 2, wherein inner walls of the second through hole are positioned further inward than inner walls of the first through hole.

4. The substrate for mounting electronic elements according to claim 2, wherein inner walls of the second through hole are positioned further outward than inner walls of the first through hole.

5. The substrate for mounting electronic elements according to claim 2, wherein a resin is disposed on an inner wall of the second through hole.

6. The substrate for mounting electronic elements according to claim 2, wherein
   the first wiring substrate and the second wiring substrate are bonded together by a first bonding material made from a conductive resin and the second wiring substrate and the metal sheet are bonded together by a second bonding material, and a resin is disposed on a side surface of the first bonding material, a inner wall of the second through hole, and a side surface of the second bonding material.

7. The substrate for mounting electronic elements according to claim 2, wherein outer edges of the metal sheet are positioned further inward than outer edges of the second wiring substrate.

8. The substrate for mounting electronic elements according to claim 2, wherein the outer edges of the second wiring substrate are positioned further inward than outer edges of the first wiring substrate.

9. The substrate for mounting electronic elements according to claim 2, wherein the first wiring substrate and the second wiring substrate are bonded together by a first bonding material made from a conductive resin.

10. The substrate for mounting electronic elements according to claim 2, wherein a resin is disposed on a side surface of the second wiring substrate.

11. The substrate for mounting electronic elements according to claim 1, wherein outer edges of the metal sheet are positioned further inward than outer edges of the second wiring substrate.

12. The substrate for mounting electronic elements according to claim 1, wherein the outer edges of the second wiring substrate are positioned further inward than outer edges of the first wiring substrate.

13. The substrate for mounting electronic elements according to claim 1, wherein the first wiring substrate and the second wiring substrate are bonded together by a first bonding material made from a conductive resin.

14. The substrate for mounting electronic elements according to claim 13, wherein
the second wiring substrate and the metal sheet are bonded together by a second bonding material, and
a resin is disposed on a side surface of the first bonding material, a side surface of the second wiring substrate, and a side surface of the second bonding material.

15. The substrate for mounting electronic elements according to claim 1, wherein a resin is disposed on a side surface of the second wiring substrate.

16. An electronic device, comprising:
a substrate for mounting electronic elements described in claim 1; and
an electronic element mounted in the electronic element mounting area.

* * * * *